United States Patent
Peter

(10) Patent No.: US 12,087,888 B2
(45) Date of Patent: Sep. 10, 2024

(54) OPTOELECTRONIC COMPONENT WITH A LUMINESCENCE CONVERSION LAYER

(71) Applicant: OSRAM Opto Semiconductors GmbH, Regensburg (DE)

(72) Inventor: Manuela Peter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 452 days.

(21) Appl. No.: 17/603,963

(22) PCT Filed: Apr. 14, 2020

(86) PCT No.: PCT/EP2020/060414
§ 371 (c)(1),
(2) Date: Oct. 15, 2021

(87) PCT Pub. No.: WO2020/212318
PCT Pub. Date: Oct. 22, 2020

(65) Prior Publication Data
US 2022/0190209 A1    Jun. 16, 2022

(30) Foreign Application Priority Data

Apr. 15, 2019 (DE) .................. 10 2019 109 909.9

(51) Int. Cl.
*H01L 33/50* (2010.01)
*H01L 25/075* (2006.01)
(Continued)

(52) U.S. Cl.
CPC ........ *H01L 33/502* (2013.01); *H01L 25/0753* (2013.01); *H01L 27/156* (2013.01);
(Continued)

(58) Field of Classification Search
CPC ..... H01L 33/502; H01L 33/42; H01L 33/504; H01L 33/30
See application file for complete search history.

(56) References Cited

U.S. PATENT DOCUMENTS

| | | |
|---|---|---|
| 2007/0034857 A1 | 2/2007 | Song |
| 2012/0260984 A1 | 10/2012 | Han |
| 2017/0194305 A1 | 7/2017 | Goeoetz et al. |
| 2020/0403027 A1 | 12/2020 | Mueller et al. |

FOREIGN PATENT DOCUMENTS

| | | |
|---|---|---|
| CN | 102660264 A | 9/2012 |
| DE | 102009051748 A1 | 5/2011 |

(Continued)

OTHER PUBLICATIONS

Balakrishna, A. et al., "Synthesis, structure and optical studies of ZnO:Eu3+,Er3+,Yb3+ thin films: Enhanced up-conversion emission", Colloids and Surfaces A: Physicochemical and Engineering Aspects, Mar. 5, 2018, pp. 123-135, vol. 540, Elsevier.

(Continued)

*Primary Examiner* — Joseph L Williams
(74) *Attorney, Agent, or Firm* — VIERING, JENTSCHURA & PARTNER MBB

(57) ABSTRACT

An optoelectronic component may include at least one light-emitting semiconductor layer sequence and at least one luminescence conversion layer having a transparent conductive oxide and at least one dopant for forming luminescence centers.

19 Claims, 7 Drawing Sheets

(51) Int. Cl.
*H01L 27/15* (2006.01)
*H01L 33/30* (2010.01)
*H01L 33/42* (2010.01)
*H01L 33/32* (2010.01)

(52) U.S. Cl.
CPC ............ *H01L 33/42* (2013.01); *H01L 33/504* (2013.01); *H01L 33/30* (2013.01); *H01L 33/32* (2013.01)

(56) References Cited

FOREIGN PATENT DOCUMENTS

| | | |
|---|---|---|
| DE | 102012101920 A1 | 9/2013 |
| DE | 102018104993 A1 | 9/2019 |
| JP | 2011236305 A | 11/2011 |
| JP | 2016135900 A | 7/2016 |

OTHER PUBLICATIONS

Liu, Tingliang et al., "Interface Study of ITO/ZnO and ITO/ SnO2 Complex Transparent Conductive Layers and Their Effect on CdTe Solar Cells", International Journal of Photoenergy 2013, 6 pages, Jan. 2013, vol. 2013, Issue 9.

Marwoto, Putut et al., "Growth of europium-doped gallium oxide (Ga2O3:Eu) thin films deposited by homemade DC magnetron sputtering", Journal of Theoretical and Applied Physics, published Aug. 30, 2012, 9 pages, vol. 6, Springer.

Ntwaeaborwa, Odireleng Martin et al., "Structural, optical and photoluminescence properties of Eu3+ doped ZnO nanoparticles", Spectrochimica Acta Part A: Molecular and Biomolecular Spectroscopy, Jul. 5, 2017, 3 pages, vol. 182, Elsevier.

Rani, Suman et al., "Excitation dependence of the photoluminescence of ZnO: Tb nanophosphor", AIP Conference Proceedings 1860, Jul. 2017, 1 page.

Senapati, S. et al., "Red emitting Eu: ZnO nanorods for highly sensitive fluroescence intensity ratio based optical thermometry", Journal of Materials Chemistry C, published Dec. 20, 2016, 4 pages, Issue 5.

Shi, Qiang et al., "Enhancing blue luminescence from Ce-doped ZnO nanophosphor by Li doping", Nanoscale Research Letters vol. published Sep. 10, 2014, 9 pages, vol. 9, issue 1, Springer.

International Search Report issued for the corresponding PCT patent application No. PCT/EP/2020/060414, dated Jun. 30, 2020, 2 pages (for informational purposes only).

German Search Report issued for the corresponding German patent application No. 10 2019 109 909.9, dated Feb. 18, 2020, 5 pages (for informational purposes only).

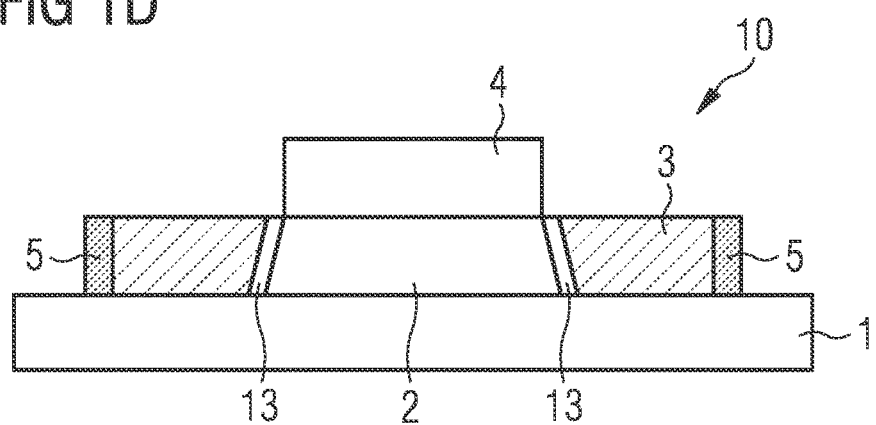
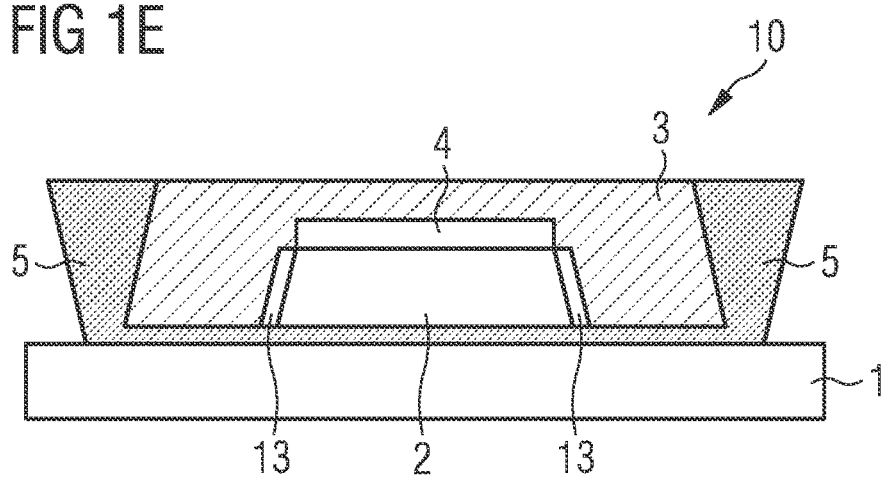

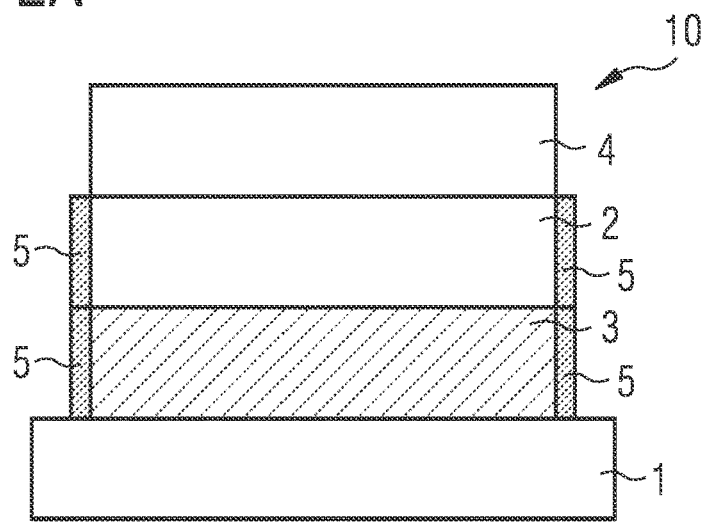
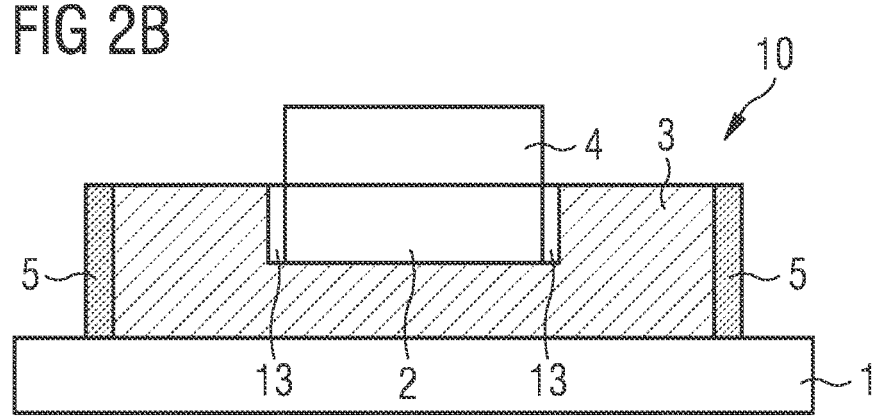
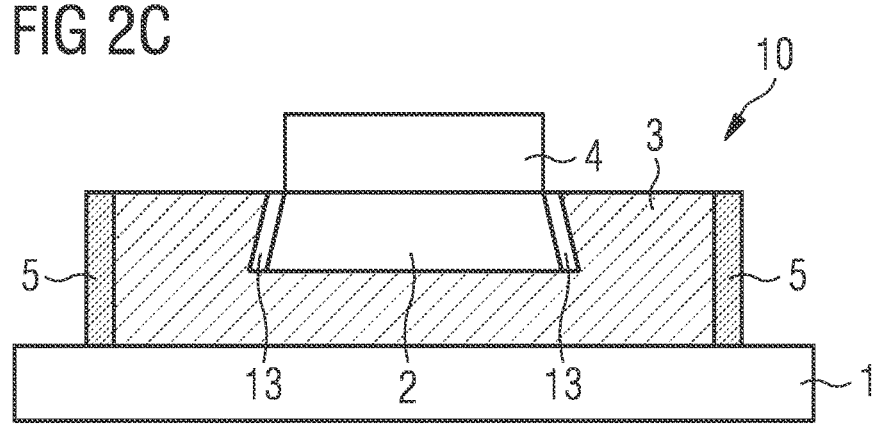

OPTOELECTRONIC COMPONENT WITH A LUMINESCENCE CONVERSION LAYER

CROSS-REFERENCE TO RELATED APPLICATIONS

The present application is a national stage entry according to 35 U.S.C. § 371 of PCT Application No. PCT/EP2020/060414 filed on Apr. 14, 2020; which claims priority to German Patent Application Serial No. 10 2019 109 909.9 filed on Apr. 15, 2019; all of which are incorporated herein by reference in their entirety and for all purposes.

TECHNICAL FIELD

The disclosure relates to an optoelectronic component with at least one light-emitting semiconductor layer sequence and at least one luminescence conversion layer.

In particular, the optoelectronic component may be a multicolor LED display in which at least one of the multiple colors is generated by means of the luminescence conversion layer.

BACKGROUND

An object to be solved is to specify an optoelectronic component in which at least part of the emitted radiation is converted into another wavelength by means of a luminescence conversion layer, wherein the luminescence conversion layer is simultaneously characterized by advantageous electrical properties.

SUMMARY

According to at least one embodiment, the optoelectronic component comprises at least one light-emitting semiconductor layer sequence and at least one luminescence conversion layer comprising a transparent conductive oxide and at least one dopant for forming luminescence centers. The luminescence conversion layer is adapted to convert all or part of a primary radiation emitted from the light-emitting semiconductor layer sequence into secondary radiation with a wavelength different from the primary radiation.

For example, the light-emitting semiconductor layer sequence comprises a p-type semiconductor region, an n-type semiconductor region, and an active layer arranged between the p-type semiconductor region and the n-type semiconductor region. The p-type semiconductor region, the n-type semiconductor region, and the active layer may each include one or more semiconductor layers. The p-type semiconductor region includes one or more p-doped semiconductor layers, and the n-doped semiconductor region includes one or more n-doped semiconductor layers. It is also possible that the p-type semiconductor region and/or the n-type semiconductor region include one or more undoped semiconductor layers. The light-emitting semiconductor layer sequence of the optoelectronic component is in particular a light emitting diode layer sequence.

The light-emitting semiconductor layer sequence of the optoelectronic component is based on a III-V compound semiconductor material, in particular on a, nitride, phosphide or arsenide compound semiconductor material. For example, the light-emitting semiconductor layer sequence may include $In_xAl_yGa_{1-x-y}N$, $In_xAl_yGa_{1-x-y}P$ or $In_xAl_yGa_{1-x-y}As$, each with $0 \leq x \leq 1$, $0 \leq y \leq 1$, and $x+y \leq 1$. In this regard, the III-V compound semiconductor material need not necessarily comprise a mathematically exact composition according to any of the above formulas. Rather, it may comprise one or more dopants as well as additional constituents. For simplicity, however, the above formulas include only the essential constituents of the crystal lattice, even though some of these may be replaced by small amounts of additional substances.

In particular, the luminescence conversion layer can be arranged in a radiation direction of the light-emitting semiconductor layer sequence and is arranged directly on the light-emitting semiconductor layer sequence. Alternatively, another transparent conductive oxide layer may be arranged between the light-emitting semiconductor layer sequence and the luminescence conversion layer. The luminescence conversion layer comprises a transparent conductive oxide that acts as a matrix material for the at least one dopant. The dopant of the transparent conductive oxide forms luminescence centers suitable for wavelength conversion of radiation emitted from the light-emitting semiconductor layer sequence. In particular, the luminescence centers may be suitable for converting emitted primary radiation of a smaller wavelength, for example UV light, blue light or green light, into secondary radiation of a larger wavelength, for example red light.

The use of a transparent conductive oxide as matrix material for the at least one dopant forming the luminescence centers has the advantage that the luminescence conversion layer is not only suitable for the conversion of radiation, but is at the same time characterized by advantageous electrical properties, in particular by its electrical conductivity. The luminescence conversion layer made of the transparent conductive oxide can advantageously be applied at comparatively low process temperatures, for example by sputtering. In particular, it is possible to apply the luminescence conversion layer directly to the light-emitting semiconductor layer sequence without damaging the light-emitting semiconductor layer sequence.

In particular, the dopant that forms the luminescent centers causes the transparent conductive oxide of the luminescent conversion layer to become a luminescent substance itself. In particular, the luminescence conversion layer containing a transparent conductive oxide with at least one dopant to form luminescent centers is not a mixture or composite of conventional photoluminescent phosphor particles or powders and conductive material or binders. Rather, the luminescence conversion layer is advantageously based on an inherently conductive photoluminescent phosphor material, such as applied as a thin film. In particular, the luminescence conversion layer can be produced by means of a vacuum coating process. Conductivity and homogeneity can be better controlled in this way than, for example, with sol-gel methods.

Advantageously, the luminescence conversion layer can also be grown on very small structures such as LED pixels.

According to a non-limiting embodiment, the transparent conductive oxide is Oxid ZnO, IZO, $Ga_2O_3$ or IGZO. According to a further embodiment, the transparent conductive oxide is $In_2O_3$, $SnO_2$, IMO or ITO. It is also conceivable to use derivatives or variations of the aforementioned materials. The dopant of the transparent conductive oxide is advantageously a material from the rare earth group, such as Eu, Er, Tb or Ce. These dopants are suitable for forming luminescent centers in a transparent oxide.

According to at least one embodiment, the luminescence conversion layer comprises at least one further dopant. The further dopant is provided, in particular, for specifically adjusting the luminescence properties and/or the electrical properties of the luminescence conversion layer. The further dopant may be a dopant that is not a rare earth material. For example, the transparent conductive oxide may be co-doped with Na, K or Li to modify the luminescence properties.

According to at least one embodiment, the further dopant is Ga, Al, K, Na or Li. The further dopant may be provided to produce n-type doping of the transparent conductive oxide. For example, Ga and Al are suitable for producing n-doping in ZnO.

According to at least one embodiment, the luminescence conversion layer comprises ZnO:Eu, ZnO:Eu, Ga, or ZnO: Eu, Al. With these materials, conversion of UV light, blue light, or green light to red light can advantageously occur.

According to at least one embodiment, the at least one luminescence conversion layer is electrically conductive and arranged between a first electrode and a second electrode of the light-emitting semiconductor layer sequence. In particular, it may be provided that the luminescence conversion layer is flown through by the operating current of the light-emitting semiconductor layer sequence. In this embodiment, the luminescence conversion layer can advantageously function simultaneously as a luminescence conversion layer and as a current guiding or current spreading layer of the light-emitting semiconductor layer sequence. The manufacturing effort for the optoelectronic component is thus simplified.

According to at least one embodiment, the luminescence conversion layer comprises a plurality of partial layers arranged in a layer stack, wherein the partial layers are separated from each other by at least one transparent barrier layer. This allows the optical and/or electrical properties of the luminescence conversion layer to be adjusted in a targeted manner. In particular, the layer stack can contain alternating partial layers of the luminescence conversion layer and barrier layers. In particular, the barrier layers cause management or confinement of charge carriers in the partial layers of the luminescence conversion layer or change the excitation or light extraction, thereby advantageously increasing the efficiency. For example, the at least one transparent barrier layer is a transparent oxide layer or nitride layer.

In a non-limiting embodiment, the at least one transparent barrier layer is between 1 nm and 200 nm thick, such as between 5 nm and 30 nm. In this case, the barrier layers are comparatively thin layers. Such thin layers are already sufficient to cause charge carrier confinement to increase the efficiency of luminescence conversion in the partial layers. For example, the multiple partial layers of the luminescence conversion layer are between 10 nm and 10 μm, such as between 50 nm and 1 μm thick.

In a non-limiting embodiment, the at least one transparent barrier layer is a transparent conductive oxide layer. In this embodiment, both the partial layers of the luminescence conversion layer and the at least one barrier layer are each electrically conductive. In particular, the layer stack comprising the partial layers of the luminescence conversion layer and the at least one barrier layer is electrically conductive as a whole and can thus advantageously function as a current guiding or current spreading layer.

According to at least one embodiment of the optoelectronic component, the light-emitting semiconductor layer sequence emits UV radiation, blue light or green light, wherein the luminescence conversion layer converts the emitted light into longer wavelength light, for example red light. In this embodiment, the luminescence conversion layer may comprise, in particular, ZnO:Eu or ZnO:Eu, X, i.e., zinc oxide doped with europium, optionally doped with one or more further dopants X. A further dopant X may be, for example, Ga or Al. In another embodiment, the luminescence conversion layer may comprise ZnO:Ce, X wherein the further dopant X is, for example, Li, Ga or Al.

According to at least one embodiment, the optoelectronic component is a multicolor LED display comprising a plurality of pixels. The pixels each comprise a light-emitting semiconductor layer sequence. The pixels are provided for generating light of a first color and at least one other color, wherein the luminescence conversion layer is arranged at least on the pixels generating the light of the first color. In particular, the light emitted from the light-emitting semiconductor layer sequence of the first pixels can be converted into the light of the first color by means of the luminescence conversion layer. For example, the light of the at least one further color may be generated directly by the light-emitting semiconductor layer sequence, i.e., it may be the primary radiation of the light-emitting semiconductor layer sequence. It is possible that in addition to the light of the first color, the light of at least one further color is also generated by luminescence conversion.

According to at least one embodiment, the light-emitting semiconductor layer sequences of the pixels are based on the same semiconductor material. "Based on the same semiconductor material" may mean, in particular, that the light-emitting semiconductor layer sequences of the pixels of the first color and the at least one second color are each based on a nitride compound semiconductor material. In particular, the light-emitting semiconductor layer sequences, especially the active layers thereof, may each comprise $In_xAl_yGa_{1-x-y}N$, wherein $0 \leq x \leq 1$, $0 \leq y \leq 1$ and $x+y \leq 1$. The light-emitting semiconductor layer sequences may advantageously be grown on the same growth substrate. A separate growth of light-emitting semiconductor layer sequences of different material systems on different growth substrates and a subsequent transfer to a common carrier substrate can be advantageously avoided.

According to at least one embodiment, the first color generated by means of the luminescence conversion layer is red. For example, the multicolor LED display is an RGB display in which a first group of pixels emits red light, a second group of pixels emits green light, and a third group of pixels emits blue light.

According to at least one embodiment, the at least one light-emitting semiconductor layer sequence and/or the at least one luminescence conversion layer are surrounded by an opaque layer in the lateral direction. This is particularly advantageous in the embodiment of the optoelectronic component as a multicolor LED display in order to prevent optical crosstalk between adjacent pixels.

The optoelectronic component can in particular be used in LED displays or can be an LED display. The LED display is in particular a multicolor LED display, for example an RGB LED display. In particular, the optoelectronic component can be used in small displays such as smartphones or watches or head-up displays.

BRIEF DESCRIPTION OF THE DRAWINGS

The accompanying drawings serve to provide an understanding of non-limiting embodiments. The drawings illustrate non-limiting embodiments and, together with the description, serve for explanation thereof. Further non-limiting embodiments and many of the intended advantages will become apparent directly from the following detailed description. The elements and structures shown in the drawings are not necessarily shown to scale relative to each other. Like reference numerals refer to like or corresponding elements and structures.

FIGS. 1A to 1E each show a schematic representation of a cross-section through an example of the optoelectronic component, FIGS. 2A to 2C each show a schematic representation of a cross-section through an optoelectronic component according to further examples.

DETAILED DESCRIPTION

Figure 1A:
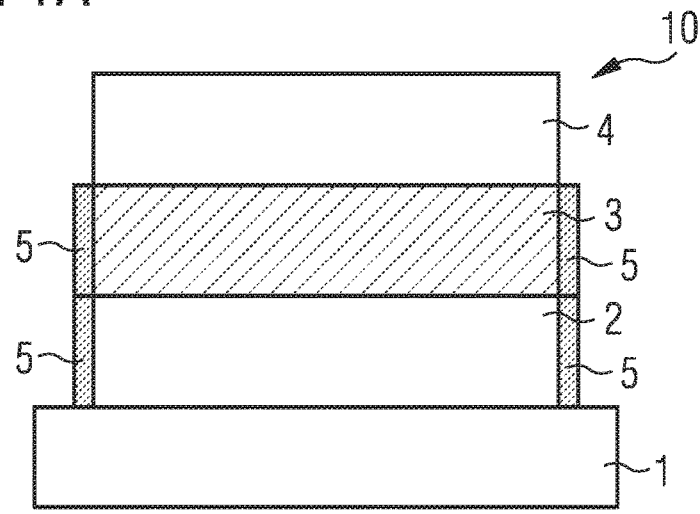

FIG. 1A shows a first example of the optoelectronic component 10. The optoelectronic component 10 comprises a light-emitting semiconductor layer sequence 2 arranged on a substrate 1. The light-emitting semiconductor layer sequence 2 is in particular a light-emitting diode layer sequence. The light-emitting semiconductor layer sequence 2 may comprise a plurality of partial layers, which are not shown individually in FIG. 1 and in the further figures for simplification. In particular, the light-emitting semiconductor layer sequence 2 may comprise an n-type semiconductor region, a p-type semiconductor region, and an active layer arranged between the n-type semiconductor region and the p-type semiconductor region. The n-type semiconductor region, the p-type semiconductor region, and the active layer may each be formed of a plurality of layers. For example, the light-emitting semiconductor layer sequence 2 may emit UV light, blue light, and/or green light. In this embodiment, the light-emitting semiconductor layer sequence 2 is, for example, a nitride compound semiconductor-based semiconductor layer sequence, which may comprise, in particular, semiconductor layers with the composition $In_xAl_yGa_{1-x-y}N$, with $0 \leq x \leq 1$, $0 \leq y \leq 1$, and $x+y \leq 1$.

It is possible that the substrate 1 is a growth substrate on which the light-emitting semiconductor layer sequence 2 is epitaxially grown. Alternatively, it is also possible that the substrate 1 is a support substrate onto which the light-emitting semiconductor layer sequence 2 has been transferred from a growth substrate. The substrate 1 may comprise at least one electrode for electrically contacting the light-emitting semiconductor layer sequence 2 and/or an electrical circuit for operating the at least one light-emitting semiconductor layer sequence 2. In particular, the optoelectronic component 10 may be an LED display with a plurality of pixels, wherein a control circuit for the pixels may be at least partially integrated into the substrate 1.

In the optoelectronic component 10, a luminescence conversion layer 3 is arranged in a emission direction of the light-emitting semiconductor layer sequence 2. In particular, the luminescence conversion layer may be directly adjacent to the light-emitting semiconductor layer sequence 2. The luminescence conversion layer 3 is suitable for converting all or at least part of a primary radiation emitted by the light-emitting semiconductor layer sequence 2 into a secondary radiation with a different wavelength. In particular, the luminescence conversion layer 3 may be provided to convert a primary radiation of a shorter wavelength into a secondary radiation of a longer wavelength. For example, the light-emitting semiconductor layer sequence 2 may emit UV light, blue light, or green light as primary radiation, and the luminescence conversion layer 3 may generate red light as secondary radiation.

The luminescence conversion layer 3 comprises a transparent conductive oxide and at least one dopant for forming luminescence centers. For example, the transparent conductive oxide comprises ZnO, $In_2O_3$, IZO, $Ga_2O_3$, IGZO, $SnO_2$, or ITO. These transparent conductive oxides are particularly characterized by the fact that the layer preparation can be carried out at comparatively low process temperatures in the region of about 300° C. to 550° C. This temperature range is compatible with LED manufacturing.

The at least one dopant is an element from the rare earth group. Non-limiting dopants are Eu, Er, Tb and Ce. The luminescence conversion layer 3 may additionally contain at least one further dopant, wherein the further dopant may be provided for selectively adjusting the electrical properties and/or the luminescence properties (efficiency, excited state lifetime). The further dopant may be an element that does not belong to the rare earth group. For example, the further dopant may be Ga or Al. By adding Ga or Al, in particular, n-doping of the transparent conductive oxide can be achieved. Alternatively, it is also conceivable to provide the transparent conductive oxide with a p-type dopant or to use an intrinsic transparent conductive oxide.

In a non-limiting embodiment, the transparent conductive oxide ZnO may be doped with Eu or Ce and optionally with one or more further dopants X. A transparent conductive oxide with the composition ZnO:Eu or ZnO:Eu, X, wherein X is, for example, Ga, Al, Na, K or Li, is particularly suitable for converting UV light, blue light or green light into red or green light.

The luminescence conversion layer 3 can be applied directly to the light-emitting semiconductor layer sequence 2, for example by a vacuum coating process such as sputtering. In this case, it is advantageous that the production by sputtering can be carried out at a comparatively low temperature, so that the already existing light-emitting semiconductor layer sequence 2 is not damaged when the luminescence conversion layer 3 is applied. Alternative coating methods for producing the luminescence conversion layer 3 include electron beam evaporation, MOCVD, ALCVD, sol-gel processes, printing processes or spin coating. Alternatively, the luminescence conversion layer can be fabricated by making and applying nanoparticles. It is possible that the luminescence conversion layer 3 is subjected to a temperature treatment after application.

As an alternative to applying the luminescence conversion layer 3 directly to the light-emitting semiconductor layer sequence, it can also be fabricated separately on a carrier substrate and subsequently transferred to the light-emitting semiconductor layer sequence 2.

In the optoelectronic component 10, a cover layer 4 may optionally be arranged over the luminescence conversion layer 3. The cover layer 4 is, for example, an encapsulation layer for protecting the optoelectronic component 10. It is also possible that the cover layer 4 comprises an optical function, for example as a color filter, for contrast enhancement or for suppression of optical crosstalk. It is also possible that the cover layer 4 contains one or more electrodes and/or electrical circuit elements for the optoelectronic component 10.

In the illustrated example, the light-emitting semiconductor layer sequence 2 and the luminescence conversion layer 3 are each surrounded by an opaque layer 5 in the lateral direction. The opaque layer 5 prevents the emitted primary radiation and/or secondary radiation from exiting the optoelectronic component 10 in the lateral direction. This is particularly advantageous for optoelectronic components which comprise several light-emitting semiconductor layer sequences 2 and/or luminescence conversion layers 3 next to each other, for example LED displays with a plurality of pixels arranged next to each other.

Figure 1B:
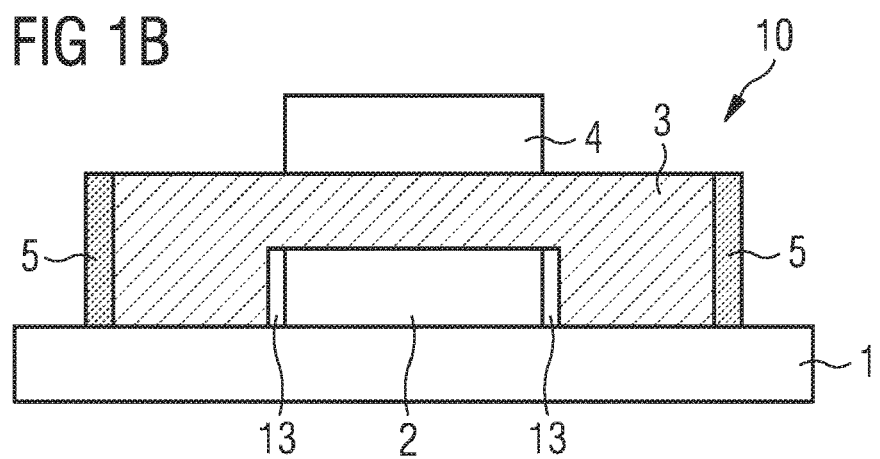

FIG. 1B illustrates another example of optoelectronic component 10. This example differs from the previous example in that the luminescence conversion layer 3 is also arranged laterally of the light-emitting semiconductor layer sequence 2. The light-emitting semiconductor layer sequence 2 is electrically isolated from the luminescence conversion layer 3 in the lateral direction by a passivation layer 13. This assembly is particularly advantageous if the light-emitting semiconductor layer sequence 2 comprises no surface roughening, so that vertical light extraction may be impaired by total reflections. This assembly can also be advantageous for light-emitting semiconductor layer sequences 2 that form small LED pixels, e.g. with an edge length of no more than 15 μm, especially if the pixel pitches are comparatively large. In this case, light exiting laterally from the light-emitting semiconductor layer sequence 2 can also be utilized and the region of light conversion can be enlarged. Crosstalk to neighboring pixels can further be prevented by the assembly of an opaque layer 5, which in this example is adjacent to the luminescence conversion layer 3.

Figure 1C:
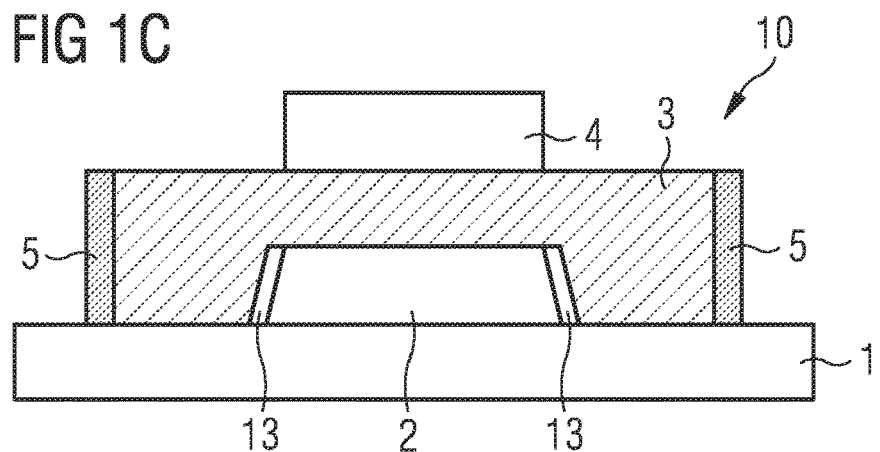

FIG. 1C illustrates another example of the optoelectronic component 10. This example differs from the previous example in that the light-emitting semiconductor layer sequence 2 comprises side edges extending obliquely with respect to the substrate 1. In particular, the light-emitting semiconductor layer sequence 2 comprises a trapezoidal cross-section. This embodiment can be advantageous for light extraction.

FIG. 1D illustrates another example of the optoelectronic component 10. This example differs from the previous example in that the luminescence conversion layer 3 is arranged exclusively laterally of the light-emitting semiconductor layer sequence 2. An opaque, in particular non-transmissive, cover layer 4 is arranged on the light-emitting semiconductor layer sequence. In this case, the light is essentially only laterally coupled out of the light-emitting semiconductor layer sequence 2. The opaque layer 5 arranged laterally of the luminescence conversion layer can in particular be reflective and cause radiation to be coupled out upwards from the luminescence conversion layer 3.

FIG. 1E illustrates another example of the optoelectronic component 10. This example differs from the previous example in that the luminescence conversion layer 3 is adapted both laterally and above the light-emitting semiconductor layer sequence 2. In this case, the cover layer 4 on the light-emitting semiconductor layer sequence can be opaque, in particular non-transmissive, or alternatively translucent. The opaque layer 5 is arranged laterally of the luminescence conversion layer 3 and can be configured as a reflector, in particular as a reflector with side flanks extending obliquely to the substrate 1. Furthermore, it is possible that the opaque layer 5 adapted as a reflector covers the substrate 1. In this way, the light radiation is intensified upwards.

FIG. 2A illustrates another example of the optoelectronic component 10 which differs from the example of FIG. 1A in the assembly of the luminescence conversion layer 3 relative to the light-emitting semiconductor layer sequence 2. In this example, the luminescence conversion layer 3 is arranged between the substrate 1 and the light-emitting semiconductor layer sequence 2. This embodiment is particularly possible when the light-emitting semiconductor layer sequence 2 is transparent to the secondary radiation generated by the luminescence conversion layer 3. Advantageously, the cover layer 4 may comprise a color filter that is, for example, transparent to the secondary radiation and non-transmissive to the primary radiation. A color filter in the cover layer 4 can also be partially transparent to the primary radiation, for example to generate a mixed light with a portion of the primary radiation and a portion of the secondary radiation. With regard to further possible configurations, the second example corresponds to the example of FIG. 1A.

FIG. 2B illustrates another example of the optoelectronic component 10. This example differs from the previous example in that the luminescence conversion layer 3 is also arranged laterally of the light-emitting semiconductor layer sequence 2. The light-emitting semiconductor layer sequence 2 is electrically isolated from the luminescence conversion layer 3 in the lateral direction by a passivation layer 13. In this case, light exiting laterally from the light-emitting semiconductor layer sequence 2 can also be utilized and the region of light conversion can be enlarged. Crosstalk to adjacent pixels can further be prevented by the assembly of an opaque layer 5, which in this example is adjacent to the luminescence conversion layer 3.

FIG. 2C illustrates another example of the optoelectronic component 10. This example differs from the previous example in that the light-emitting semiconductor layer sequence 2 comprises side edges extending obliquely with respect to the substrate 1. In particular, the light-emitting semiconductor layer sequence 2 comprises a trapezoidal cross-section. This embodiment can be advantageous for light extraction.

Figure 3A:
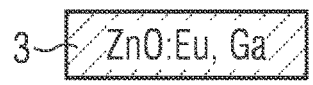
FIG. 3A shows a schematic representation of a cross-section through an example of the luminescence conversion layer.

FIG. 3A illustrates a possible embodiment of the luminescence conversion layer 3. In this example, the luminescence conversion layer 3 is a single layer comprising ZnO: Eu, Ga. Alternatively, the luminescence conversion layer 3 may comprise any of the other previously mentioned materials.

Figure 3B:
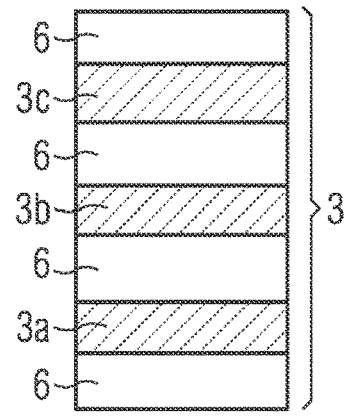
FIG. 3B shows a schematic representation of a cross-section through a further example of the luminescence conversion layer.

FIG. 3B illustrates an advantageous configuration of the luminescence conversion layer 3. In this example, the luminescence conversion layer 3 is not a single layer, but a layer stack. The layer stack comprises several partial layers 3a, 3b, 3c of the luminescence conversion layer, each of which is a transparent conductive oxide layer doped with at least one dopant for forming luminescence centers and optionally one or more further dopants, as in the previous examples. A barrier layer 6 is arranged before and after each of the partial layers 3a, 3b, 3c. The barrier layers 6 can be, for example, oxide or nitride layers. In a non-limiting embodiment, the transparent barrier layers 6 are thin layers that are only between 1 nm and 200 nm thick, such as between 5 nm and 30 nm thick. The barrier layers 6 can serve to optimize the luminescence properties, for example by charge carrier management or confinement in the partial layers 3a, 3b, 3c. Additionally or alternatively, other properties of the layers in the layer stack such as layer thicknesses, doping with charge carriers, band structure or refractive indices can be used to optimize the luminescence properties as well as the optical and/or electronic properties of the luminescence conversion layer 3.

In a non-limiting embodiment, the barrier layers 6 are transparent conductive oxide layers. For example, the barrier layers contain ZnO:Ga or ITO. Thus, the layer stack of the luminescence conversion layer 3 can be an alternating layer sequence of alternating transparent conductive oxide layers 3a, 3b, 3c with luminescence centers and further transparent conductive oxide layers forming the barrier layers 6.

Figure 4:
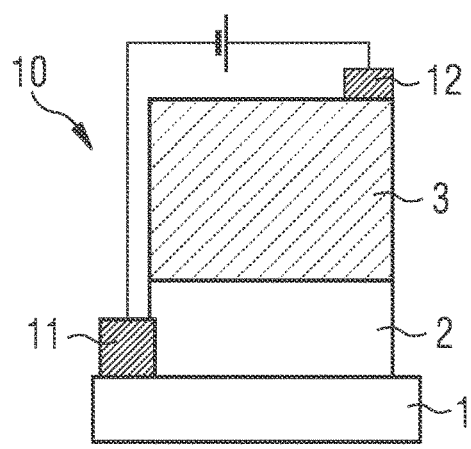
FIG. 4 shows a schematic representation of a cross-section through an optoelectronic component according to a further example.

FIG. 4 illustrates another example of optoelectronic component 10. In this example, the luminescence conversion layer 3 is arranged between a first electrode 11 and a second electrode 12 of the optoelectronic component 10. In this embodiment, particular advantage is taken of the fact that the luminescence conversion layer 3 is electrically conductive. In particular, during operation of the optoelectronic component 10, the operating current of the light-emitting semiconductor layer sequence 2 flows through the luminescence conversion layer 3. In this case, the luminescence conversion layer 3 can advantageously have a dual function as a luminescence conversion layer and a current spreading layer of the optoelectronic component 10. The luminescence conversion layer 3 comprises, for example, ZnO:Eu, Ga, X.

Figure 5:
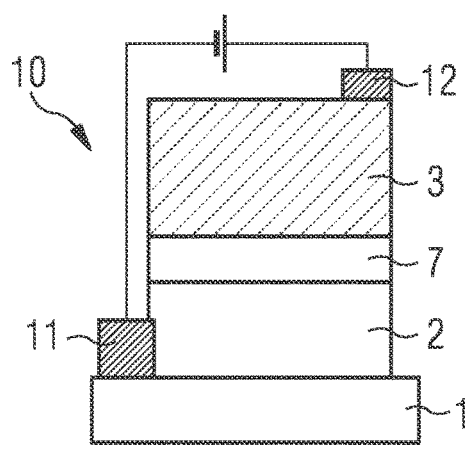
FIG. 5 shows a schematic representation of a cross-section through an optoelectronic component according to a further example.

FIG. 5 illustrates a modification of the example of FIG. 4, in which a further transparent conductive oxide layer 7 is arranged between the luminescence conversion layer 3 and the light-emitting semiconductor layer sequence 2, which may comprise a transparent conductive oxide without luminescence centers. Here, the further transparent conductive oxide layer 7 may act as a current spreading layer. As in the previous example, the luminescence conversion layer 3 is arranged between the first electrode 11 and the second electrode 12 of the optoelectronic component and has the operating current of the light-emitting semiconductor layer sequence 2 flowing through it.

The luminescence conversion layer 3 comprises, for example, ZnO:Eu, Ga and the further transparent conductive oxide layer 7 comprises ZnO:Ga or ITO.

Figure 6:
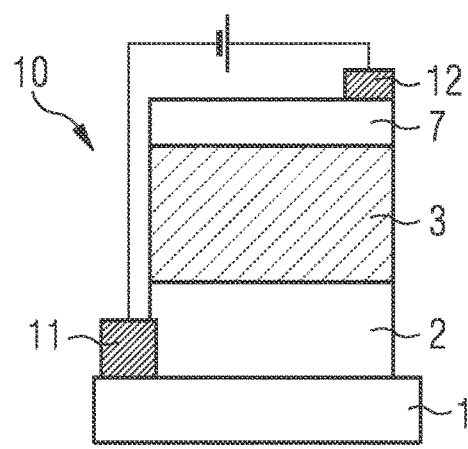
FIG. 6 shows a schematic representation of a cross-section through an optoelectronic component according to a further example.

FIG. 6 illustrates a further variation of the example of FIG. 4, in which the further transparent conductive oxide layer 7 is arranged between the luminescence conversion layer 3 and the second electrode 12. As in the previous example, the further transparent conductive oxide layer 7 functions as a current spreading layer of the optoelectronic component 10. The luminescence conversion layer 3 is arranged between the first electrode 11 and the second electrode 12 of the optoelectronic component, and the operating current of the light-emitting semiconductor layer sequence 2 flows through it.

Figure 7:
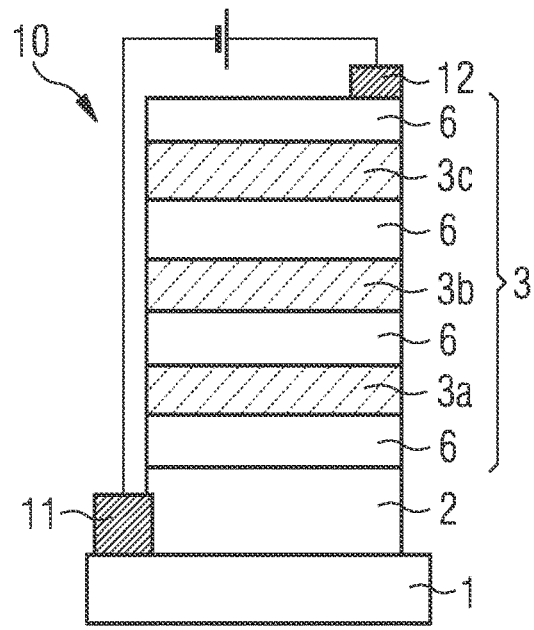
FIG. 7 shows a schematic representation of a cross-section through an optoelectronic component according to a further example.

In the further example of FIG. 7, a layer stack is arranged between the light-emitting semiconductor layer sequence 2 and the second electrode 12 of the optoelectronic component 10, which forms a luminescence conversion layer 3 according to the example of FIG. 3. The layer stack comprises alternating partial layers 3a, 3b, 3c of the luminescence conversion layer and transparent barrier layers 6 arranged therebetween, which comprise a transparent conductive oxide and are thus electrically conductive. For example, the partial layers 3a, 3b, 3c of the luminescence conversion layer 3 comprise ZnO:Eu, Ga and the transparent barrier layers comprise ZnO:Ga or ITO.

In the examples of FIGS. 1 to 7, an optoelectronic component with only one light-emitting semiconductor layer sequence 2 is shown in each case for simplicity. A luminescence conversion layer according to the principle proposed herein is particularly suitable for LED displays in which a plurality of pixels, each formed by a light-emitting semiconductor layer sequence, are arranged side by side. In particular, the optoelectronic component 10 may be a multicolor LED display comprising a plurality of pixels, wherein the pixels are provided for emitting different colors. For example, the optoelectronic component may be an RGB display. In the case of a multicolor LED display, the luminescence conversion layer may be applied to at least the pixels of a first color according to the principle proposed herein.

Figure 8:
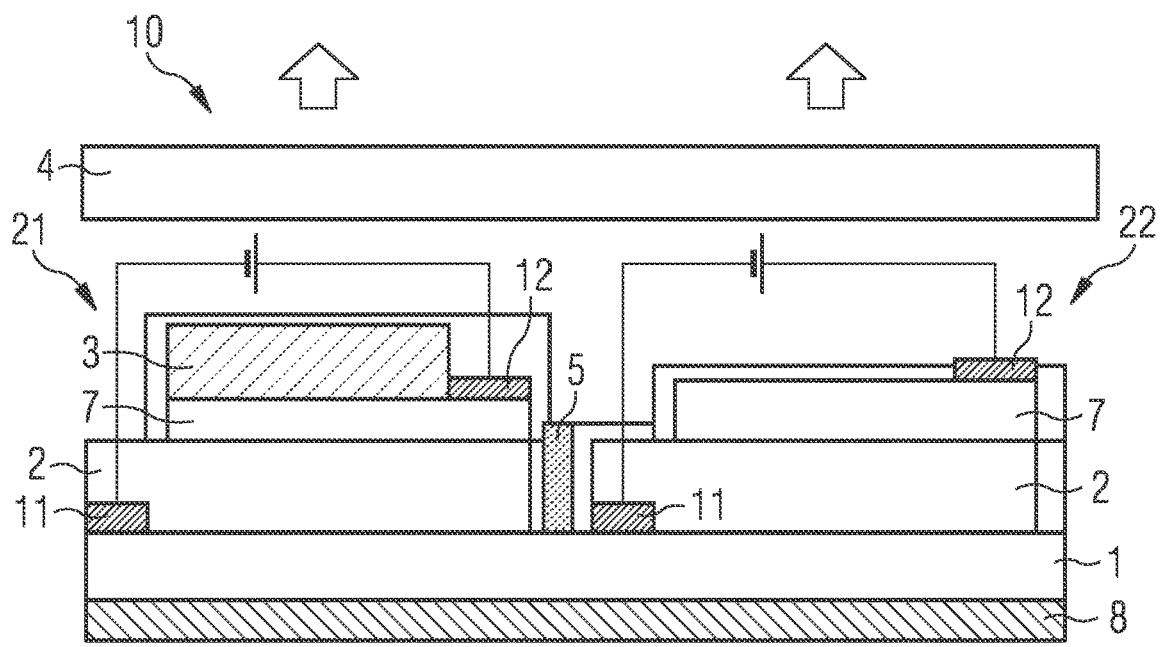
FIG. 8 shows a schematic representation of a cross-section through an optoelectronic component according to a further example.

FIG. 8 schematically illustrates a cross-sectional view of an optoelectronic component 10, exemplarily comprising two pixels 21, 22 arranged side by side for emitting different colors. The optoelectronic component 10 may comprise a plurality of such pixels 21, 22, for example at least 1000, at least 100,000 or even at least 1,000,000. The optoelectronic component 10 comprises a plurality of light-emitting semiconductor layer sequences 2 arranged side by side, each of which is associated with a pixel 21, 22 of the optoelectronic component 10. At least above a pixel 21 of a first color is arranged the luminescence conversion layer 3, which comprises a transparent conductive oxide with luminescence centers. For example, the luminescence conversion layer 3 is a layer comprising ZnO:Eu, Ga. In this case, the pixel 21 with the luminescence conversion layer 3 may be for emitting red light, for example.

In the pixel 21 with the luminescence conversion layer 3, another transparent conductive oxide layer 7 is arranged here as a current spreading layer between the light-emitting semiconductor layer sequence 2 and the luminescence conversion layer 3, as an example. Alternatively, the layer structure of the pixel 21 may comprise one of the other embodiments described previously according to FIGS. 1 to 7. The optoelectronic component 10 further comprises at least one second pixel 22 that is not covered by a luminescence conversion layer 3. For example, the second pixel 22 has only the transparent conductive oxide layer 7 arranged as a current spreading layer on the light-emitting semiconductor layer sequence 2. In this case, the second pixel 22 emits the primary radiation of the light-emitting semiconductor layer sequence 2, for example, blue light or green light.

The optoelectronic component 10 may additionally comprise a plurality of further pixels 21 of the first color and further pixels 22 of the second color. Furthermore, the optoelectronic component 10 may comprise pixels of at least one further color. In particular, the optoelectronic component 10 may be a multicolor LED display, for example an RGB LED display.

The pixels 21, 22 of the optoelectronic component 10 are advantageously arranged on a common substrate 1, which may be a growth substrate for the light-emitting semiconductor layer sequences 2, for example a sapphire substrate. Alternatively, the substrate 1 may be a support substrate onto which the light-emitting semiconductor layer sequences 2 have been transferred from a growth substrate. In a configuration, a reflective and/or contrast enhancing layer 8 is arranged below the substrate 1. An opaque layer 5 is arranged between the pixels 21, 22 of the optoelectronic component 10.

Furthermore, it is possible that a cover layer 4 is arranged above the pixels 21, 22, which, for example, forms an encapsulation of the optoelectronic component. It is also possible that the cover layer 4 comprises an optical and/or electrical function. For example, the cover layer 4 may comprise at least one color filter or comprise electrical circuit elements for driving the pixels 21, 22.

Figure 9:
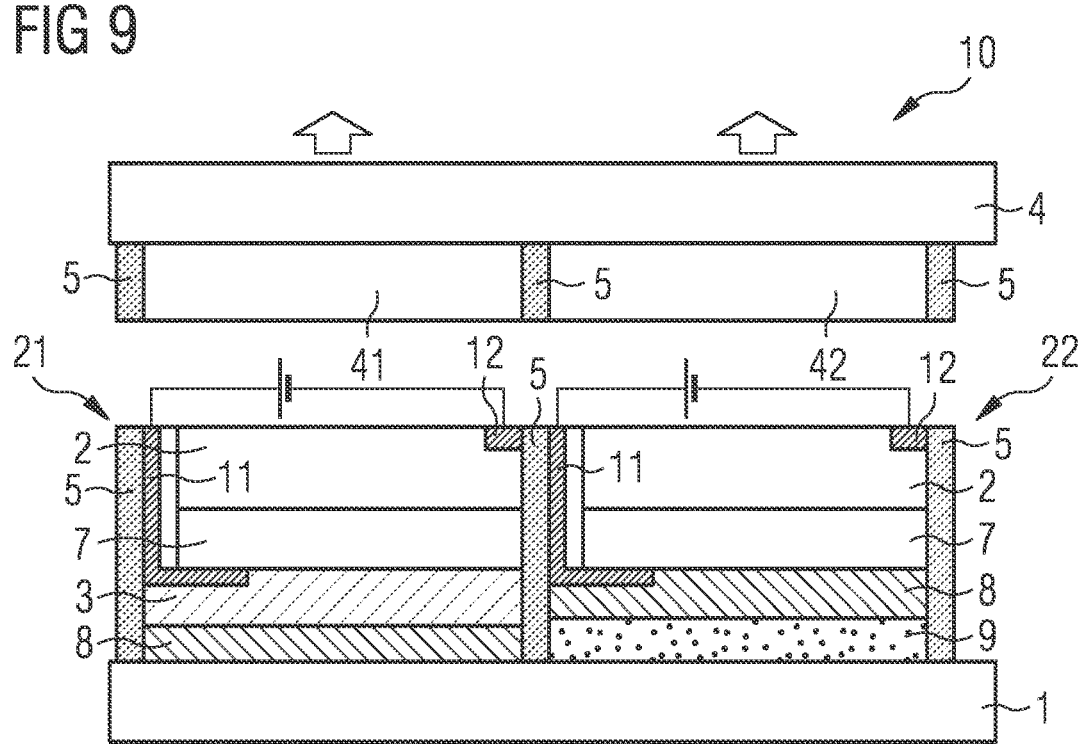
FIG. 9 shows a schematic representation of a cross-section through an optoelectronic component according to a further example.

FIG. 9 illustrates another embodiment of the optoelectronic component 10 with multiple pixels 21, 22. This example differs from the previous example in that the luminescence conversion layer 3 and the further transparent conductive oxide layer 7 of the at least one first pixel 21 are arranged between the substrate 1 and the light-emitting semiconductor layer sequence 2. Furthermore, in the at least one second pixel 22, which does not comprise a luminescence conversion layer, a further conductive layer, for example a transparent conductive oxide layer 7, is arranged between the substrate 1 and the light-emitting semiconductor layer sequence 2.

The contacting of the light-emitting semiconductor layer sequence 2 takes place in each case by means of a first electrode 11 and a second electrode 12, wherein in this example the first electrode 11 is arranged in each case against the further transparent conductive oxide layer 7 and the second electrode is arranged in each case against an upper side of the light-emitting semiconductor layer sequence. In addition, a reflective and/or a contrast-enhancing layer 8, in particular a black matrix, may be arranged between the substrate 1 and the light-emitting semiconductor layer sequence 2, respectively. Since no luminescence conversion layer is arranged in the second pixel 22, a filler layer 9 can be provided to compensate for the height difference with respect to the first pixel 21, which can be arranged, for example, between the substrate 1 and the reflective or contrast-enhancing layer 8.

A first color filter layer 41 for a first color may be arranged over the first pixel 21, and a second color filter or luminescence conversion layer 42 for a second color may be arranged over the second pixel 22. For example, the first color filter layer 41 may be provided to transmit the converted radiation of the first pixel, for example red light, and the second color filter or luminescence conversion layer 42 may be provided to filter out the primary radiation of the second pixel 22, for example blue or green light, or to produce the second color by luminescence conversion. An opaque layer 5 is advantageously arranged between each of the color filters 41, 42 and between each of the pixels 21, 22.

Figure 10:
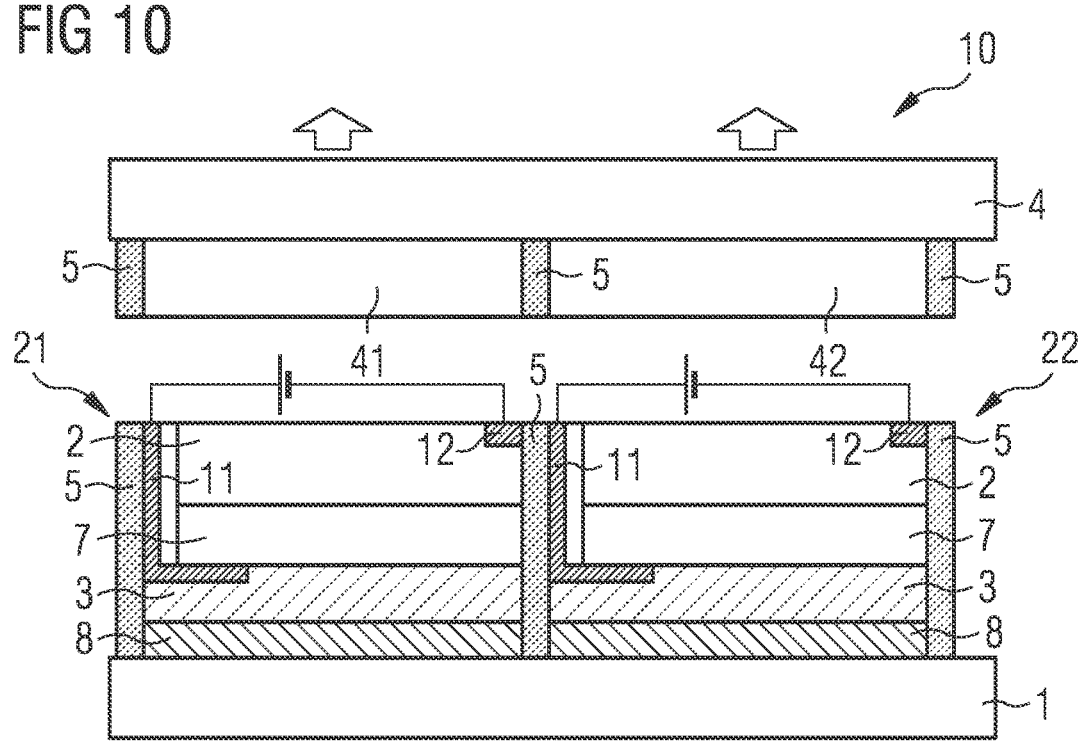
FIG. 10 shows a schematic representation of a cross-section through an optoelectronic component according to a further example.

FIG. 10 illustrates a variation of the example in FIG. 9, which differs from the previous example in that the first pixel 21 and the second pixel 22 comprise the same layer structure. The manufacturing effort can thus be simplified. In this example, the emission of light of different colors can be achieved by arranging a first color filter layer 41 for a first color over the first pixel 21 and a second color filter or luminescence conversion layer 42 for a second color over the second pixel 22. For example, the first color filter layer 41 may be provided to filter out the converted radiation of the first pixel, for example red light, and the second color filter or luminescence conversion layer 42 may be provided to filter out the primary radiation of the second pixel 22, for example blue or green light, or to produce the second color by luminescence conversion. An opaque layer 5 is advantageously arranged between each of the color filter or luminescence conversion layers 41, 42 and between each of the pixels 21, 22. The electrical contacting of the light-emitting semiconductor layer sequences 2 can be effected by a first electrode 21 and a second electrode 22, which are each electrically conductively connected with the transparent conductive oxide layer 7 and the upper side of the light-emitting semiconductor layer sequence 2.

Figure 11:
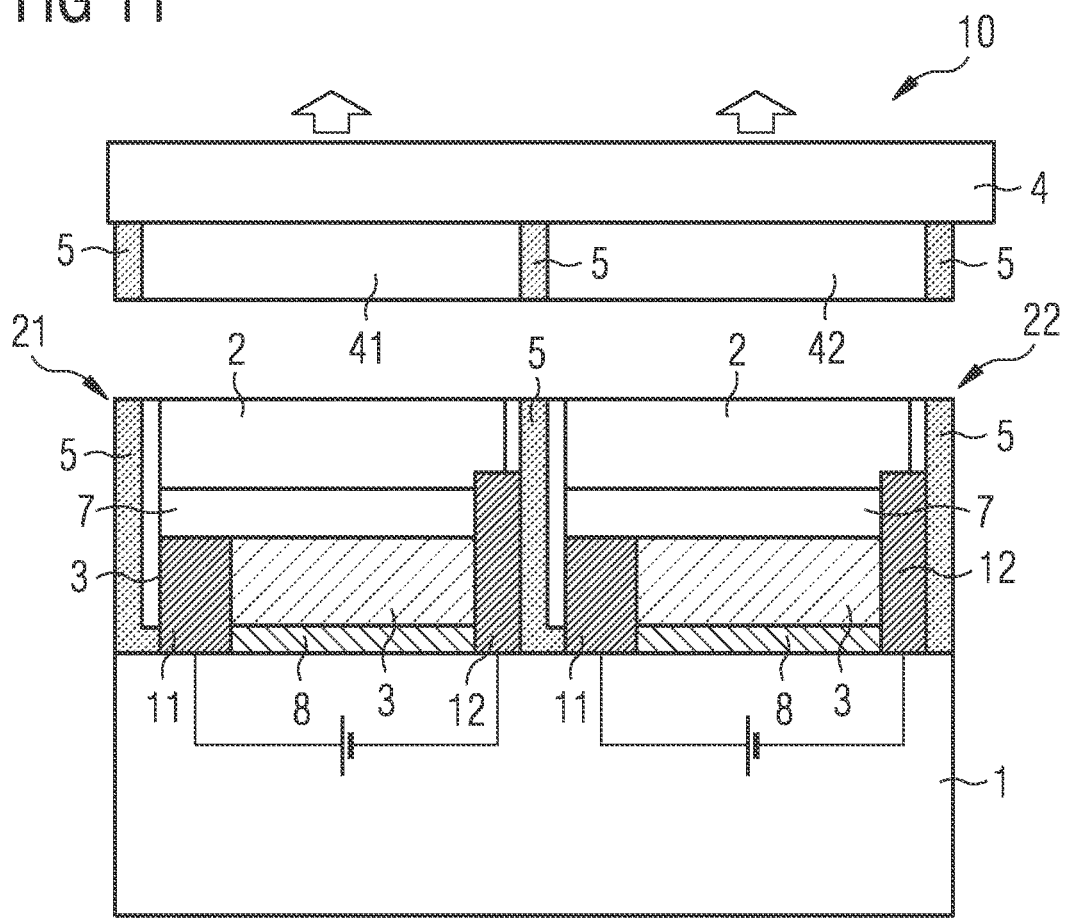
FIG. 11 shows a schematic representation of a cross-section through an optoelectronic component according to a further example.

In FIG. 11, a variation of the example of FIG. 10 is shown that differs from the previous example in the way of the electrical contacting. In the example shown here, the substrate 1 is a carrier substrate that comprises an electrical driver for the pixels 21, 22. For example, the substrate 1 may include circuits based on thin film transistors (TFT). Alternatively, passive matrix elements may be arranged in the substrate 1, which may be particularly advantageous for use in small displays. The contacting of the light-emitting semiconductor layer sequences 2 is performed from the side of the substrate 1 by means of a first electrode 11 and a second electrode 12, respectively.

The invention is not limited by the description based on the exemplary embodiments. Rather, the invention encompasses any new feature as well as any combination of features, which in particular includes any combination of features in the claims, even if that feature or combination itself is not explicitly specified in the claims or exemplary embodiments.

LIST OF REFERENCE SIGNS 1 substrate
2 light-emitting semiconductor layer sequence
3 luminescence conversion layer
3a partial layer of the luminescence conversion layer
3b partial layer of the luminescence conversion layer
3c partial layer of the luminescence conversion layer
4 cover layer
5 opaque layer
6 barrier layer
7 transparent conductive oxide layer
8 reflective or contrast enhancing layer
9 filling layer
10 optoelectronic component
11 first electrode
12 second electrode
13 passivation layer
21 first pixel
22 second pixel
41 first color filter layer
42 second color filter or luminescence conversion layer

The invention claimed is:
1. An optoelectronic component comprising:
at least one light-emitting semiconductor layer sequence; and
at least one luminescence conversion layer comprising a transparent conductive oxide and at least one dopant for forming luminescence centers;
wherein the at least one luminescence conversion layer comprises alternatingly a plurality of partial layers arranged in a layer stack, wherein at least one transparent barrier layer is arranged in each case between the partial layers.
2. The optoelectronic component according to claim 1, wherein the transparent conductive oxide is ZnO, IZO, $Ga_2O_3$, IGZO, or combinations thereof.

3. The optoelectronic component according to claim 1, wherein the transparent conductive oxide is $In_2O_3$, $SnO_2$, IMO, ITO, or combinations thereof.

4. The optoelectronic component according to claim 1, wherein the at least one dopant is Eu, Er, Tb, Ce, or combinations thereof.

5. The optoelectronic component according to claim 1, wherein the at least one luminescence conversion layer comprises at least one further dopant.

6. The optoelectronic component according to claim 5, wherein the at least one further dopant is Ga, Al, K, Na, Li, or combinations thereof.

7. The optoelectronic component according to claim 1, wherein the at least one luminescence conversion layer comprises ZnO:Eu, ZnO:Eu, Ga, ZnO:Eu, Al, or combinations thereof.

8. The optoelectronic component according to claim 1, wherein the at least one luminescence conversion layer is electrically conductive and arranged between a first electrode and a second electrode of the at least one light-emitting semiconductor layer sequence.

9. The optoelectronic component according to claim 1, wherein the at least one transparent barrier layer has a thickness ranging from 1 nm to 200 nm.

10. The optoelectronic component according to claim 1, wherein the plurality of partial layers have a thickness ranging from 10 nm to 10 μm.

11. The optoelectronic component according to claim 1, wherein the at least one transparent barrier layer is a transparent conductive oxide layer.

12. The optoelectronic component according to claim 1, wherein the at least one light-emitting semiconductor layer sequence emits UV radiation, blue light, or green light; and wherein the at least one luminescence conversion layer converts the emitted light into red light or green light.

13. The optoelectronic component according to claim 1, wherein the optoelectronic component is a multicolor LED display comprising a plurality of pixels where each pixel comprises a light-emitting semiconductor layer sequence of the at least one light-emitting semiconductor layer sequence;
wherein the plurality of pixels are provided for emitting light of a first color and at least one further color, and wherein the at least one luminescence conversion layer is arranged at least on the pixels of the first color.

14. The optoelectronic component according to claim 13, wherein the first color is red or green.

15. The optoelectronic component according to claim 13, wherein the light-emitting semiconductor layer sequences of the pixels are based on the same semiconductor material.

16. The optoelectronic component according to claim 1, wherein the at least one light-emitting semiconductor layer sequence and/or the at least one luminescence conversion layer is surrounded in the lateral direction by an opaque layer.

17. The optoelectronic component according to claim 1, wherein the transparent conductive oxide is IZO, $Ga_2O_3$, IGZO, or combinations thereof.

18. An optoelectronic component comprising:
at least one light-emitting semiconductor layer sequence; and
at least one luminescence conversion layer comprising a transparent conductive oxide and at least one dopant for forming luminescence centers;
wherein the at least one luminescence conversion layer is also arranged laterally of the at least one light-emitting semiconductor layer sequence.

19. The optoelectronic component according to claim 18, wherein the at least one luminescence conversion layer comprises a plurality of partial layers arranged in a layer stack, wherein the plurality of partial layers are separated from each other by at least one transparent barrier layer.

* * * * *